(12) United States Patent
Orita

(10) Patent No.: US 7,102,175 B2
(45) Date of Patent: Sep. 5, 2006

(54) SEMICONDUCTOR LIGHT-EMITTING DEVICE AND METHOD FOR FABRICATING THE SAME

(75) Inventor: Kenji Orita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 131 days.

(21) Appl. No.: 10/820,055

(22) Filed: Apr. 8, 2004

(65) Prior Publication Data

US 2004/0206969 A1    Oct. 21, 2004

(30) Foreign Application Priority Data

Apr. 15, 2003   (JP)   ............................. 2003-110113
May 20, 2003   (JP)   ............................. 2003-141710

(51) Int. Cl.
*H01L 33/00* (2006.01)

(52) U.S. Cl. .......................................... 257/97; 257/94
(58) Field of Classification Search .......... 257/94–103, 257/79, 13–19, 76–82, 200
See application file for complete search history.

(56) References Cited

U.S. PATENT DOCUMENTS 6,495,862 B1    12/2002   Okazaki et al.
2003/0057444 A1*   3/2003   Niki et al. .................. 257/200

FOREIGN PATENT DOCUMENTS

JP    P2000-196152 A    7/2000

OTHER PUBLICATIONS

Hiroyuki Ichikawa, et al., "High Efficiency Light Emitting Diode with 2-D Surface Grating Photonic Crystal", Optical Society of America, 2002.

* cited by examiner

*Primary Examiner*—Cuong Nguyen
(74) *Attorney, Agent, or Firm*—McDermott Will & Emery LLP

(57) ABSTRACT

Projections/depressions of a two-dimensional periodic structure are formed in a p-GaN layer (4) such that the period of the projections/depressions is 1 to 20 times the wavelength of light radiated from an active layer (3) in a semiconductor. As a result, a diffractive effect achieved by the projections/depressions of the two-dimensional periodic structure change the direction in which the light radiated from the active layer (3) travels. If the projections/depressions are not provided, light at a radiation angle which satisfies conditions for total reflection at the interface between a semiconductor device and an air cannot be extracted to the outside of the semiconductor device so that the light emission efficiency of the device is low. By contrast, the projections/depressions as formed with a period according to the present invention diffract the light at an angle which does not cause total reflection so that the efficiency with which the light is extracted to the outside of the semiconductor device is improved exponentially. This improves the light emission efficiency of the device.

15 Claims, 12 Drawing Sheets

SEMICONDUCTOR LIGHT-EMITTING DEVICE AND METHOD FOR FABRICATING THE SAME

BACKGROUND OF THE INVENTION

The present invention relates to a semiconductor light-emitting device and, more particularly, to a semiconductor light-emitting device made of a nitride compound semiconductor such as GaN, InGaN, AlGaN, or the like.

In recent years, the use of a nitride compound semiconductor represented by GaN has allowed a high-intensity emission of light ranging in color from ultraviolet to blue and green, which had been impossible thus far. As a result, light-emitting devices using nitride compound semiconductors, such as a light-emitting diode (LED) and a semiconductor laser, have been developed vigorously. Since an LED is easier to fabricate and control than a semiconductor laser and longer in lifespan than a fluorescent lamp, an LED using a nitride compound semiconductor is considered to be promising as a light source for illumination.

A description will be given herein below to an example of a conventional nitride compound semiconductor LED. FIG. 16 is a perspective view showing a structure of the conventional nitride compound semiconductor LED disclosed in FIG. 10 of Prior Art Document 1 (Japanese Laid-Open Patent Publication No. 2000-196152).

In the conventional LED, as shown in FIG. 16, a sapphire substrate 101, a GaN buffer layer (not shown), an n-type GaN layer 102, an InGaN active layer 103, and a p-type GaN layer 104 are formed successively by crystal growth and a trench 108 for exposing the n-type GaN layer 102 as the bottom surface thereof has been formed by partly etching away the InGaN active layer 103 and the p-type GaN layer 104. An n-side electrode 106 is provided on the portion of the n-type GaN layer 102 exposed as the bottom surface of the trench 108, while a p-side transparent electrode 105 is provided on the p-type GaN layer 104 and a p-side bonding electrode 107 is provided on a part of the p-side transparent electrode 105.

The following is the operation of the LED. Holes injected through the p-side bonding electrode 107 expand laterally in the p-side transparent electrode 105 to be injected into the InGaN active layer 103 from the p-type GaN layer 104. On the other hand, electrons injected through the n-side electrode 106 are injected into the InGaN active layer 103 from the n-type GaN layer 102. Light emission occurs upon the recombination of the holes with the electrons in the InGaN active layer 103. The light is emitted to the outside of the LED through the p-side transparent electrode 105.

However, such a conventional structure has the problem of low light extraction efficiency. The light extraction efficiency is the ratio of light generated in the active layer and emitted from the LED into an air to all the light generated in the active layer. The cause of the low light extraction efficiency is the refractivity of a semiconductor which is higher than that of the air. As a result, the light from the active layer is totally reflected by the interface between the semiconductor and the air and confined to the inside of the LED. For example, the refractivity of GaN is about 2.45 when the wavelength of the light is 450 nm so that a critical refractive angle at which total reflection occurs is as small as about 23 degrees. That is, light radiated from the active layer at an angle larger than the critical refractive angle in terms of a normal to the interface between the semiconductor and the air is totally reflected by the interface between the semiconductor and the air so that the light emitted from the active layer and extractable to the outside of the LED accounts for only about 4% of all the light emitted from the active layer. Thus, the conventional LED using a nitride compound semiconductor is low in external quantum efficiency (the ratio of light that can be extracted from the LED to currents supplied to the LED) and has the problem of power conversion efficiency (the ratio of a light output that can be produced to all the supplied power) lower than that of a fluorescent lamp.

As a solution to the problem, a technology which forms projections/depressions at the surface of the LED has been proposed, as disclosed in FIG. 5 of Prior Art Document 1. FIG. 17 is a perspective view showing the structure of the conventional nitride compound semiconductor LED disclosed in FIG. 5 of Prior Art Document 1.

In the structure shown in FIG. 17, projections/depressions each of a spherical lens structure have been formed in the p-type GaN layer 104. The structure has the possibility that, even though the angle formed between emitted light and a normal to the interface between the flat portion of the p-type transparent electrode 105 and the air is larger than the critical refractive angle, the angle of incidence of the light becomes smaller than the critical refractive angle if it is incident on the portion provided with the projections/depressions. Accordingly, the probability that the light generated in the active layer is emitted to the outside of the LED without being totally reflected increases and the external quantum efficiency is thereby improved.

However, the technology for improving the light extraction efficiency based on the principle proposed in Prior Art Document 1 is disadvantageous in that, because the angle of incidence of light sensitively varies in response to the configuration of a projecting and depressed surface, the design of the projecting and depressed surface is extremely difficult and characteristics are unstable due to size variations during the fabrication of devices. The technology is also disadvantageous in that, though the projections/depressions to be formed should have a depth of about several micrometers to improve the light extraction efficiency, processing is difficult because of the high etching resistance of a nitride compound semiconductor.

SUMMARY OF THE INVENTION

It is therefore an object of the present invention to provide a light-emitting diode having a nitride compound semiconductor, which features high external quantum efficiency, stable characteristics, and easy design and processing.

A semiconductor light-emitting device according to the present invention comprises: an element having: a semiconductor multilayer film containing a nitride and having an active layer; and a transparent layer provided on the semiconductor multilayer film and having projections/depressions of a two-dimensional periodic structure at an upper surface thereof to diffract light from the active layer at the projections/depressions and guide the diffracted light to an outside of the semiconductor multilayer film.

In the arrangement, the radiation angle of the light relative to the interface between the transparent layer and an air, which is larger than a critical refractive angle when the light is emitted from the active layer, becomes smaller than the critical refractive angle. This enables light that has been totally reflected conventionally to be extracted to the outside and thereby improves light extraction efficiency.

To cause diffraction, it is sufficient for the projections/depressions to have a two-dimensional periodic structure. Unlike a diffraction grating of a one-dimensional periodic structure, the two-dimensional periodic structure exerts a diffractive effect on light at a radiation angle in any direction so that it is highly effective in improving the light extraction efficiency. Since diffraction occurs provided that projections/depressions are arranged with regular pitches in vertical and lateral directions, the influence of variations in the configuration and size of the projections/depressions on the light extraction efficiency is reduced compared with the conventional embodiment which improves the light extraction efficiency by providing the lens and thereby refracting light. This ensures high light extraction efficiency even if the configuration and size of the projections/depressions vary during the fabrication process, allows easy design and processing, and improves the fabrication yield.

When a distance between each of depressed portions of the projections/depressions and the active layer is D and a wavelength of the light from the active layer in the element is $\lambda$, if $D \leq 5\lambda$ is satisfied, the projections/depressions and the active layer are in proximity so that the diffractive effect improves the light extraction efficiency even if the height of each of the projections/depressions is not so large, which allows easy processing.

When a period of the projections/depressions is L and a wavelength of the light from the active layer in the element is $\lambda$, if $\lambda \leq L \leq 20\lambda$ is satisfied, diffraction occurs effectively to improve the light extraction efficiency. If $\lambda < 1$ is satisfied, the angle changed by diffraction is excessively large so that the light extraction efficiency is not improved. If $\lambda > 20$ is satisfied, the light extraction efficiency is reduced. This is because an excessively long period lowers the diffraction efficiency so that the proportion of a portion of light having its radiation angle changed by diffraction is reduced.

When a height of each of the projections/depressions is h and a wavelength of the light from the active layer in the element is $\lambda$, if $h \leq 5\lambda$ is satisfied, the projections/depressions to be formed need not be so high so that easy processing is allowed.

The transparent layer may be a first nitride semiconductor layer and an electrode layer may further be provided on the first nitride semiconductor layer. In this case, the diffraction efficiency is high and the light extraction efficiency is high because the projections/depressions are formed directly in the nitride semiconductor layer with a high refractivity.

In this case, an upper surface of the electrode layer may be provided with projections/depressions reflecting the projections/depressions of the upper surface of the first nitride semiconductor layer.

Alternatively, the electrode layer may be a metal or a metal oxide having a film thickness of 50 nm or less.

Alternatively, the electrode layer may be an indium tin oxide.

The semiconductor multilayer film may further have a nitride semiconductor layer of a first conductivity type provided on the active layer and a nitride semiconductor layer of a second conductivity type provided under the active layer and the transparent layer may have an electrode layer provided on the nitride semiconductor layer of the first conductivity type.

In this case, an upper surface of the electrode layer may be provided with the projections/depressions of a two-dimensional periodic structure. The arrangement allows easy and uniform injection of the currents irrespective of the projections/depressions of the nitride semiconductor layer of the first conductivity type and prevents a reduction in power conversion efficiency due to non-uniform current injection.

Alternatively, the transparent layer may further have a layer provided on the electrode layer and having the projections/depressions of a two-dimensional periodic structure. Since the electrode layer is not processed in this structure, it does not incur an adverse effect such as non-uniform current injection compared with the case where the transparent electrode is formed with projections/depressions. As a result, the light extraction efficiency can be improved without lowering the power conversion efficiency. Since conductivity is not required of the transparent layer, a material can be selected with higher flexibility than in the case of forming projections/depressions in the nitride semiconductor layer or in the transparent electrode. By using an easily processible material for the transparent layer and adopting a low cost fabrication method, a low cost device is implemented.

When the electrode layer is a metal or a metal oxide having a film thickness of 50 nm or less, it is possible to establish compatibility between conductivity and transmittance so that high power efficiency is implemented.

The electrode layer may be an indium tin oxide.

The layer having the projections/depressions of a two-dimensional periodic structure may be made of a resin. When the layer having the projections/depressions of a two-dimensional periodic structure is made of a resin, the projections/depressions can be formed by pressing. In this case, extremely fine projections/depressions can be formed easily without using a semiconductor process such as lithography or etching. This reduces the fabrication throughput and cost and implements a semiconductor light-emitting device low in cost and high in efficiency.

When each of projecting portions of the projections/depressions of the transparent layer has a flat upper surface, easier molding can be performed.

A method for fabricating a semiconductor light-emitting device according to the present invention is a method for fabricating a semiconductor light-emitting device having a semiconductor multilayer film containing a nitride and having an active layer and a transparent layer provided on the semiconductor multilayer film, the method comprising the steps of: (a) forming the transparent layer on the semiconductor multilayer film; and (b) after the step (a), pressing an upper surface of the transparent layer against a mold die having a surface provided with projections/depressions of a two-dimensional periodic structure and thereby forming, at the upper surface of the transparent layer, projections/depressions in inverted relation to the projections/depressions of the mold die.

The arrangement allows easy formation of extremely fine projections/depressions with a two-dimensional period without using a semiconductor process such as lithography or etching. This reduces the fabrication throughput and cost and implements a semiconductor light-emitting device low in cost and high in efficiency.

BRIEF DESCRIPTION OF THE DRAWINGS

FIGS. 12A and 12B are graphs showing the characteristics of a semiconductor light-emitting device according to the first embodiment, of which FIG. 12A shows a current-voltage characteristic and FIG. 12B shows a current-light output characteristic;

DETAILED DESCRIPTION OF THE INVENTION

Figure 1:
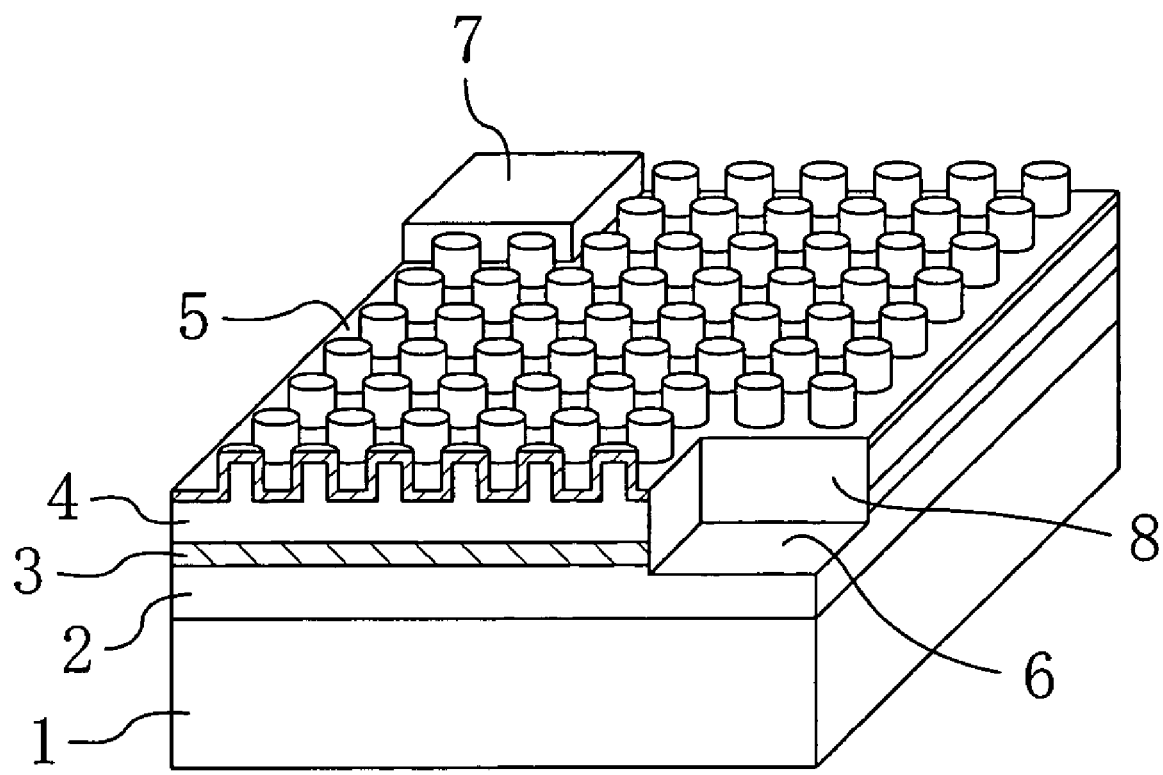
FIG. 1 is a perspective view showing a structure of a semiconductor light-emitting device according to a first embodiment of the present invention.

Referring to the drawings, the individual embodiments of the present invention will be described herein below in greater detail.

EMBODIMENT 1

FIG. 1 is a perspective view showing a structure of a semiconductor light-emitting device according to a first embodiment of the present invention. As shown in FIG. 1, the semiconductor light-emitting device according to the present embodiment is an LED comprising: a sapphire substrate 1; a non-doped GaN buffer layer (not shown) provided on the sapphire substrate 1 and having a thickness of 30 nm; an n-type GaN layer 2 provided on the GaN buffer layer, doped with an n-type impurity at a concentration of $2 \times 10^{18}$ cm$^{-3}$, and having a thickness of 2 μm; an InGaN active layer 3 provided on the n-type GaN layer 2, made of non-doped In$_{0.45}$Ga$_{0.55}$N with a PL (photoluminescence) peak wavelength of 450 nm, and having a thickness of 3 nm; and a p-type GaN layer 4 doped with a p-type impurity at a concentration of $7 \times 10^{17}$ cm$^{-3}$ and having a thickness of 400 nm. These nitride compound semiconductors are formed by crystal growth such as MOCVD (Metal-Organic Chemical Vapor Deposition) or MBE (Molecular Beam Epitaxy). In the present specification, "non-doped" indicates that intentional doping has not been performed.

A trench 8 for exposing the n-type GaN layer 2 as the bottom surface thereof has been formed by partly etching away the InGaN active layer 3 and the p-type GaN layer 4. The trench 8 is formed by, e.g., forming a resist mask (not shown) having an opening over the p-type GaN layer 4 by photolithography and then partly removing the p-type GaN layer 4 and the InGaN active layer 3 by using a dry etching technology such as RIE (Reactive Ion Etching) or ion milling, a photochemical etching technology involving the radiation of ultraviolet light, or a wet etching technology using a heated acid/alkaline solution.

Projections/depressions of a two-dimensional periodic structure are formed at the upper surface of the p-type GaN layer 4. The period of the projections/depressions, i.e., the spacing between the respective centers of the adjacent depressed or projecting portions in a vertical or lateral direction in a two-dimensional plane is 1 μm and the height of each of the projections/depressions is 200 nm. These projections/depressions are formed by forming a resist (not shown) on the p-type GaN layer 4, patterning the resist in accordance with the arrangement of the projections/depressions of the two-dimensional periodic structure by a method or system such as interference exposure, electron beam exposure, or a stepper (step-and-repeat photolithographic system with demagnification), and then performing dry etching or wet etching using the resist as a mask.

As a transparent electrode 5, an ITO (Indium Tin Oxide), e.g., is deposited to a thickness of 100 nm on the p-type GaN layer 4 formed with the projections/depressions. The ITO can be formed by sputtering or the like. For the transparent electrode 5, not only a conductive metal oxide such as the ITO but also a metal thin film high in conductivity and low in contact resistance can be used provided that it shows a high transmittance to the light emission wavelength of the LED. In that case, the metal thin film preferably has a thickness of 50 nm or less to retain a high transmittance. For the transparent electrode 5, a multilayer film composed of, e.g., Ni with a film thickness of 10 nm and Au with a film thickness of 40 nm provided thereon can be used.

A Ti/Al n-side electrode 6 is provided on the portion of the n-type GaN layer 2 exposed as the bottom surface of the trench 8. Further, an Au p-side bonding electrode 7 is provided on the ITO transparent electrode 5 provided on the region of the p-type GaN layer 4 unformed with projections/depressions.

Although the upper surface of the transparent electrode 5 is provided with the projections/depressions reflecting the projections/depressions of the upper surface of the p-type GaN layer 4 (transparent layer) in FIG. 1, it is also possible to provide the upper surface of the p-type GaN layer 4 with projections/depressions and provide a flat transparent electrode 5 thereon in the present embodiment.

In the semiconductor light-emitting device according to the present embodiment, the projections/depressions with a two-dimensional period are formed at the surface of the p-type GaN layer 4 so that the light from the active layer 3 is diffracted. As a result of diffraction, the radiation angle of the light relative to the interface between the semiconductor and the air, which is larger than the critical refractive angle when the light is emitted from the active layer, becomes smaller than the critical refractive angle. In contrast to the conventional embodiment in which the light forming an angle larger than the critical refractive angle between itself and a normal to the interface between the semiconductor light-emitting device and the air is totally reflected, such light is diffracted in the present embodiment to be extracted to the outside of the LED so that the light extraction efficiency is improved. The present invention is characterized by a two-dimensional periodic structure, which is different from a diffraction grating in which projections/depressions have a periodic structure only in one direction. Since the projections/depressions of the two-dimensional periodic structure exert a diffractive effect on light radiated in any direction, they are highly effective in improving the light extraction efficiency.

Figure 2A:
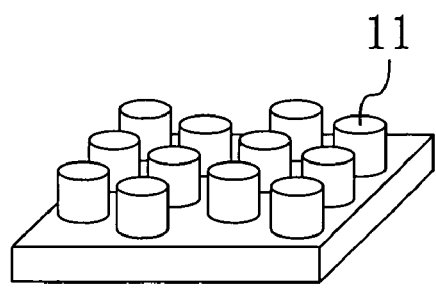
FIGS. 2A to 2D are perspective views and plan views showing specific arrangements of projections/depressions of a two-dimensional periodic structure.
Figure 2C:
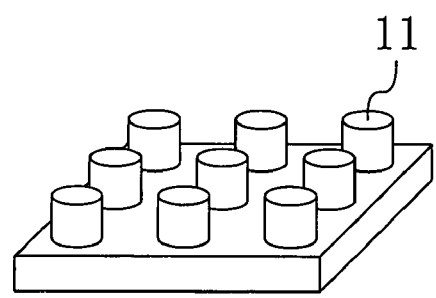
Figure 2B:
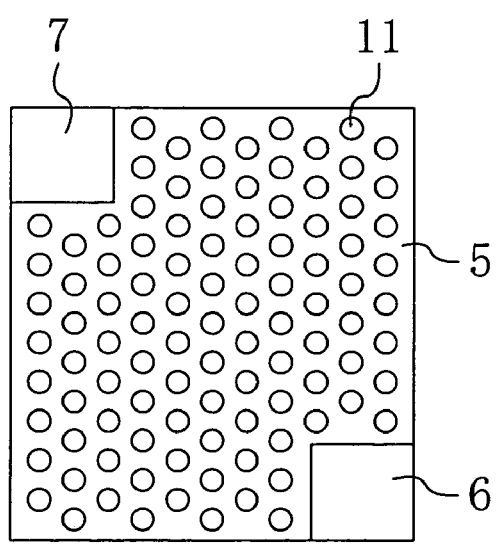
Figure 2D:
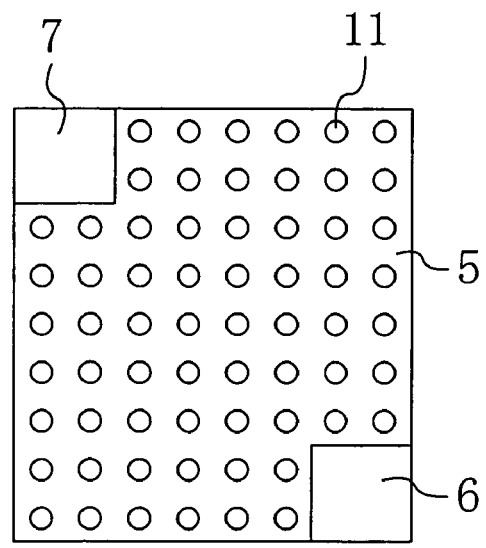
Figure 3A:
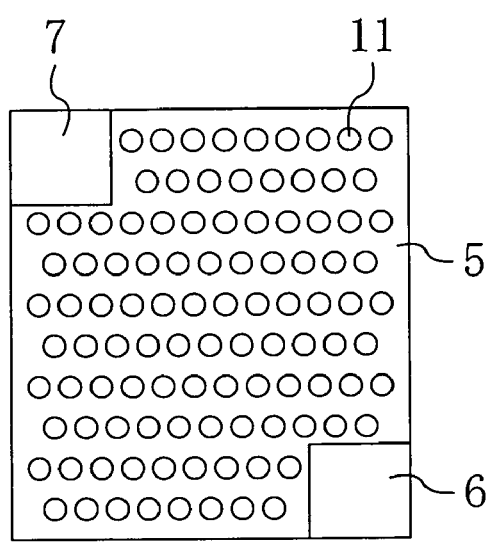
FIGS. 3A and 3B are plan views showing those of the specific arrangements in which the pitch of the projections/depressions of a two-dimensional periodic structure is different in different directions.
Figure 3B:
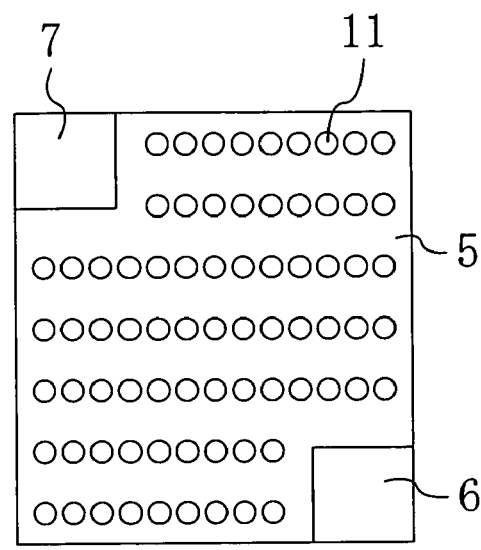
Figure 4:
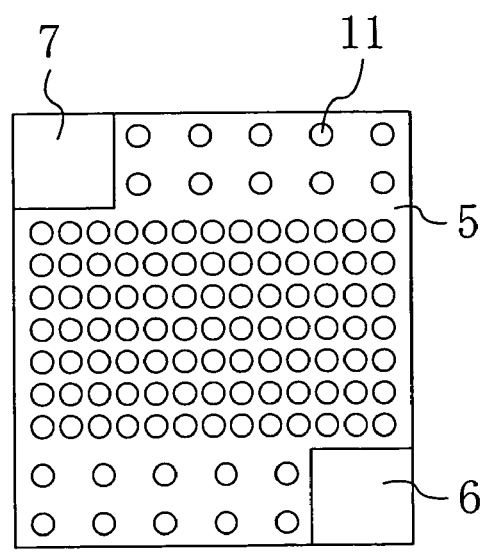
FIG. 4 is a plan view showing that of the specific arrangements in which the pitch of the projections/depressions of a two-dimensional periodic structure is different in different regions.
Figure 5A:
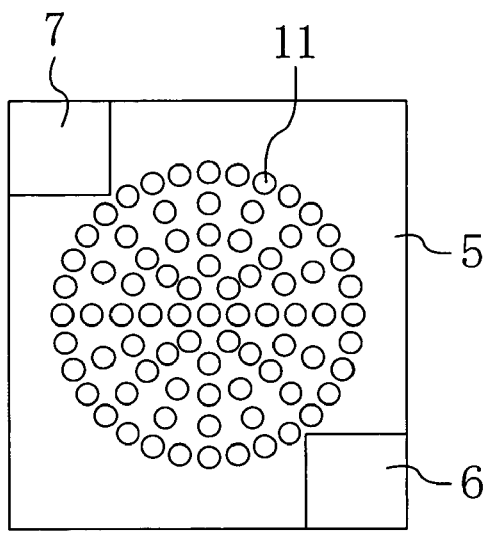
FIGS. 5A and 5B are plan views each showing a structure in which the projections/depressions of a two-dimensional periodic structure are provided at only one portion of an electrode.
Figure 5B:
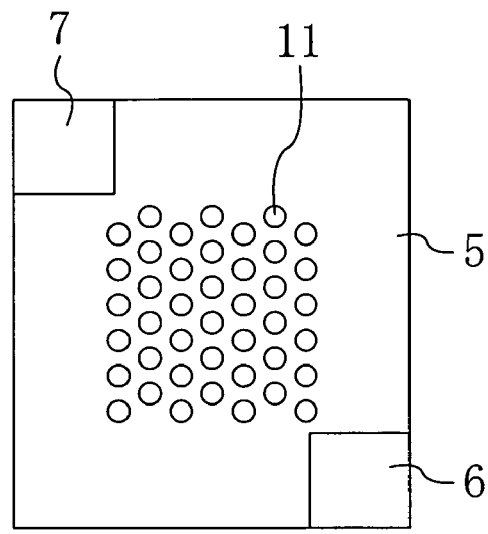
Figure 6A:
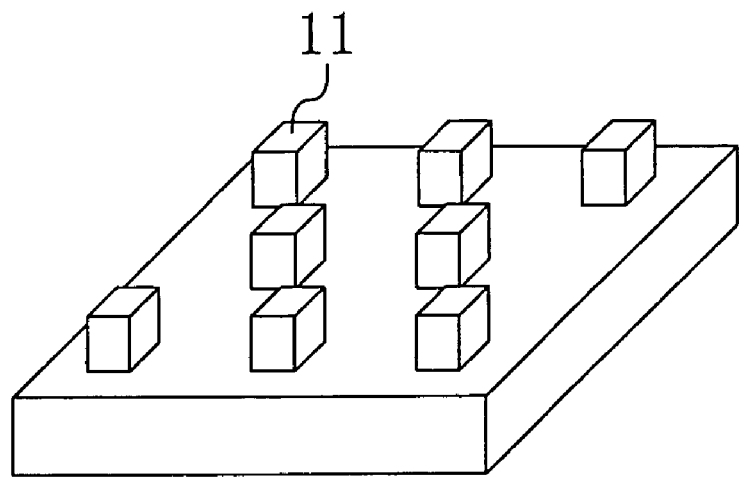
FIGS. 6A and 6B are perspective views showing specific configurations of projecting portions arranged in a two-dimensional periodic structure.
Figure 6B:
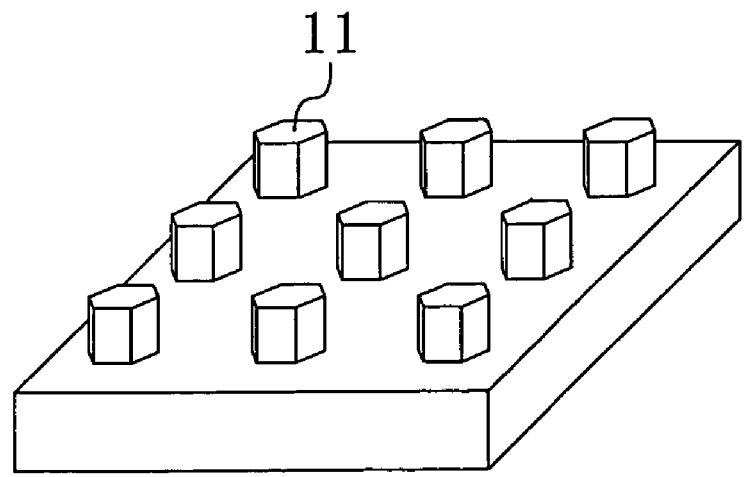
Figure 7A:
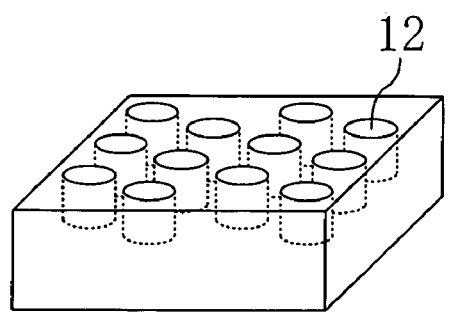
FIGS. 7A to 7D are perspective views and plan views showing structures in which depressed portions are arranged in a two-dimensional periodic structure.
Figure 7C:
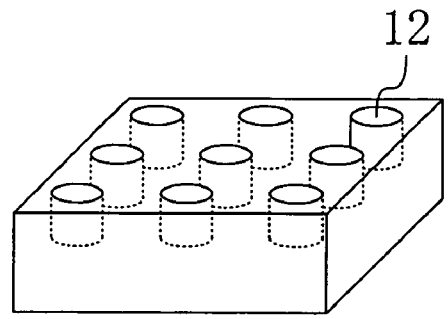
Figure 7B:
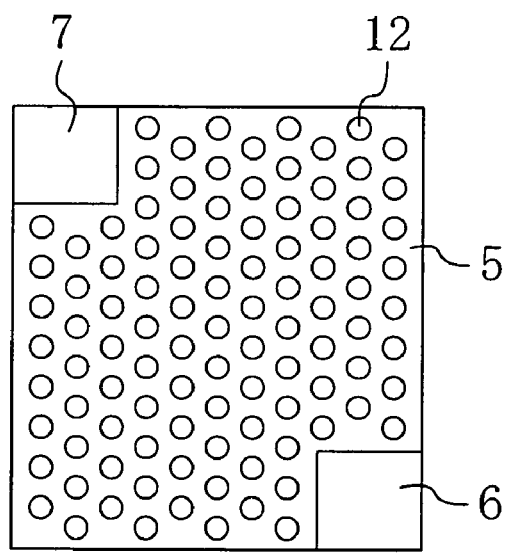
Figure 7D:
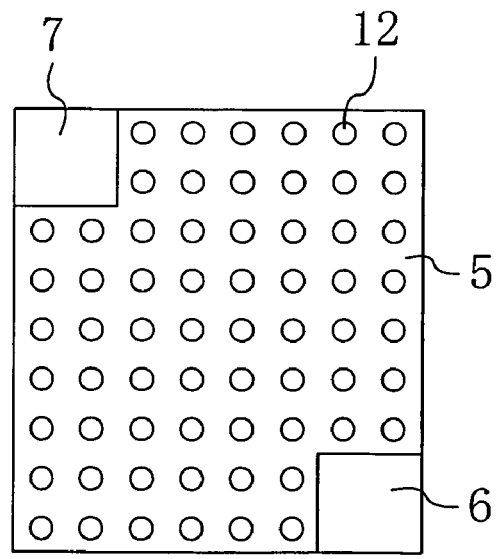

A description will be given herein below to the specific types of the two-dimensional periodic structure with reference to the drawings. FIGS. 2A to 7D are perspective views and plan views showing the specific types of the two-dimensional periodic structure, of which FIG. 2A shows the case where projecting portions 11 are arranged in a triangular lattice and FIG. 2C shows the case where the projecting portions 11 are arranged in a tetragonal lattice. FIGS. 2B and 2D show respective structures obtained when these projecting portions 11 are actually formed on the upper surfaces of the transparent electrodes 5. The projecting portions 11 may also have different periods in different directions. Specifically, the projecting portions 11 may be arranged in a triangular or tetragonal lattice in which the pitch of the adjacent projecting portions 11 is different in different directions, as shown in FIGS. 3A and 3B. The period of the projecting portions 11 may also be different in different regions. Specifically, the projecting portions may be provided in a state denser at the center portion of the transparent electrode 5 and in a state less dense at the upper and lower portions thereof than at the center portion, as shown in FIG. 4. The projections/depressions may be provided at only one portion of the transparent electrode 5. Specifically, the projecting portions 11 may be arranged to be rotationally symmetrical relative to the center portion of the transparent electrode 5, as shown in FIG. 5A. Alternatively, the projecting portions 11 may be provided only at the center of the transparent electrode 5 and the portion surrounding the center portion may be flat, as shown in FIG. 5B. The projections/depressions may also have configurations other than cylindrical columns. Specifically, the projecting portions 11 may be tetragonal columns or hexagonal columns, as shown in FIGS. 6A and 6B. In each of the foregoing structures, depressed portions may be arranged with a two-dimensional period instead of the projecting portions. Specifically, depressed portions 12 may be arranged in a triangular lattice, as shown in FIG. 7A, or in a tetragonal lattice, as shown in FIG. 7C. FIGS. 7B and 7D show respective structures obtained when these depressed portions 12 are actually formed in the upper surfaces of the transparent electrodes 5.

Figure 8:
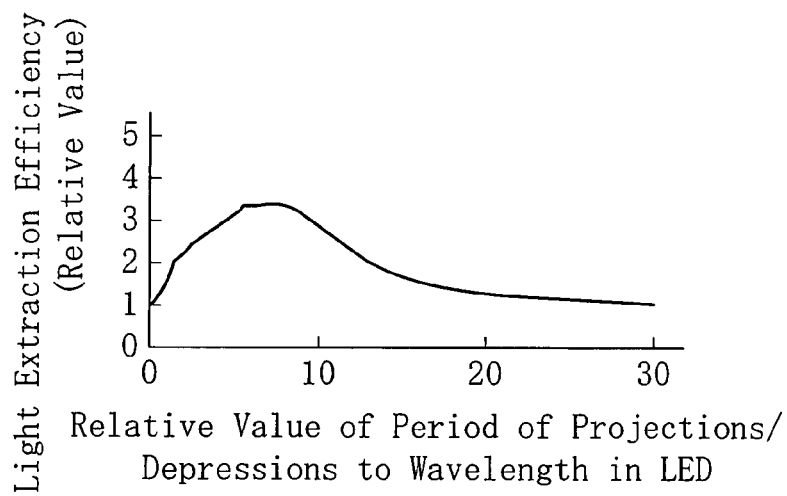
FIG. 8 is a graph showing the result of theoretically calculating a relationship between the period of projections/depressions and light extraction efficiency in the first embodiment.

A description will be given herein below to a relationship between the period of the projections/depressions and the light extraction efficiency with reference to FIG. 8. FIG. 8 is a graph showing the result of theoretically calculating the relationship between the period of the projections/depressions and the light extraction efficiency in the first embodiment. The period of the projections/depressions indicates the spacing between the respective centers of those of the projections or depressions equally spaced in vertical and lateral directions which are adjacent in a vertical or lateral direction in a two-dimensional plane. In the graph, the abscissa represents the period of the projections/depressions normalized to a wavelength in the LED at a light emission wavelength of 450 nm, i.e., a relative value of the period of the projections/depressions to the wavelength in the LED and the ordinate represents light extraction efficiency normalized to a value when the projections/depressions are not formed. Here, the wavelength in the LED is a value obtained by dividing the light emission wavelength in vacuum or in an atmosphere by the refractivity of a semiconductor. When the light emission wavelength is 450 nm and the refractivity of the semiconductor is 2.5, the wavelength is the LED becomes 180 nm.

From FIG. 8, it can be seen that the light extraction efficiency has increased while the period of the projections/depressions is in the range of 1 to 20 times the wavelength in the LED. Since the projections/depressions are formed directly in the nitride compound semiconductor layer having refractivity as high as 2.5, high diffraction efficiency is achieved so that the light extraction efficiency has improved greatly to four times the conventional light extraction efficiency at the maximum.

When the period of the projections/depressions is equal to or less than the wavelength in the LED, diffraction causes an excessively large change in angle, which leads to a post-diffraction radiation angle larger than the critical refractive angle, so that the light extraction efficiency does not improve. When the period of the projections/depressions is twenty times the wavelength in the LED or more also, the excessively long period lowers diffraction efficiency and reduces the proportion of a portion of light having its radiation angle changed by diffraction so that the effect of improving light extraction efficiency lowers disadvantageously.

To thus cause diffraction, it is sufficient for the projections/depressions to have a two-dimensional periodic structure. In short, it is sufficient for the projections/depressions to have regular pitches in vertical and lateral directions. Compared with the conventional embodiment which refracts light with the provision of the lens and thereby improves the light extraction efficiency, variations in the configuration and size of the projections/depressions have less influence on the light extraction efficiency in the present embodiment. This ensures high light extraction efficiency even when the configuration and size of the projections/depressions vary during the fabrication process so that the present embodiment facilitates design and processing and improves a fabrication yield.

Figure 9:
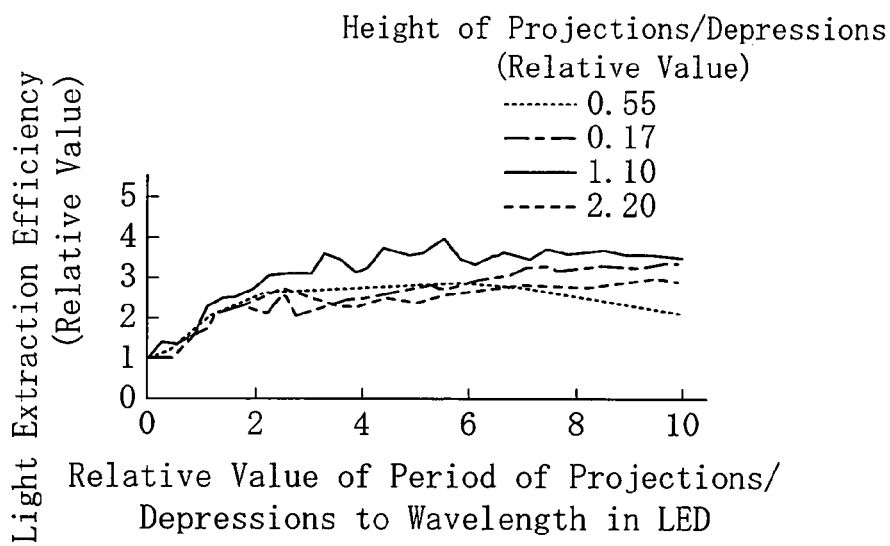
FIG. 9 is a graph showing the result of theoretically calculating the relationship between the period of projections/depressions and the light extraction efficiency by varying the height of the projections/depressions in the first embodiment.
Figure 10:
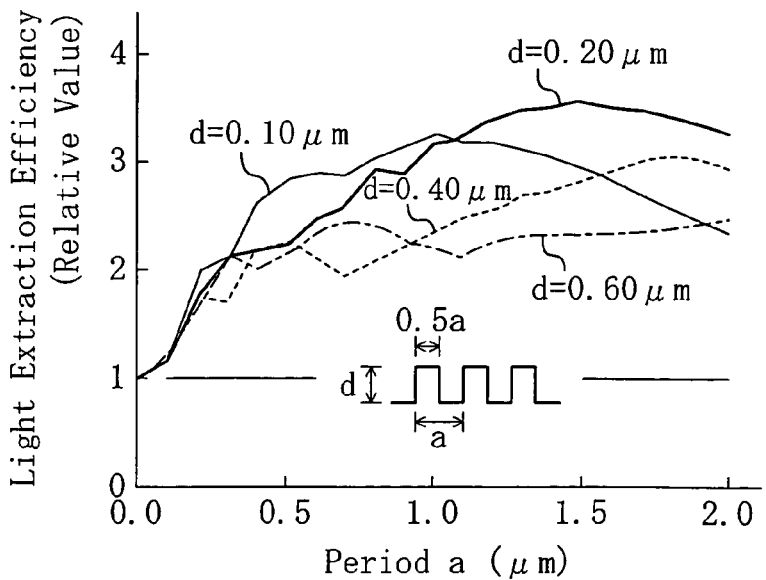
FIG. 10 is a graph showing a relationship between the height of the projections/depressions and the light extraction efficiency in an LED at a light emission wavelength of 450 nm in the first embodiment.
Figure 11:
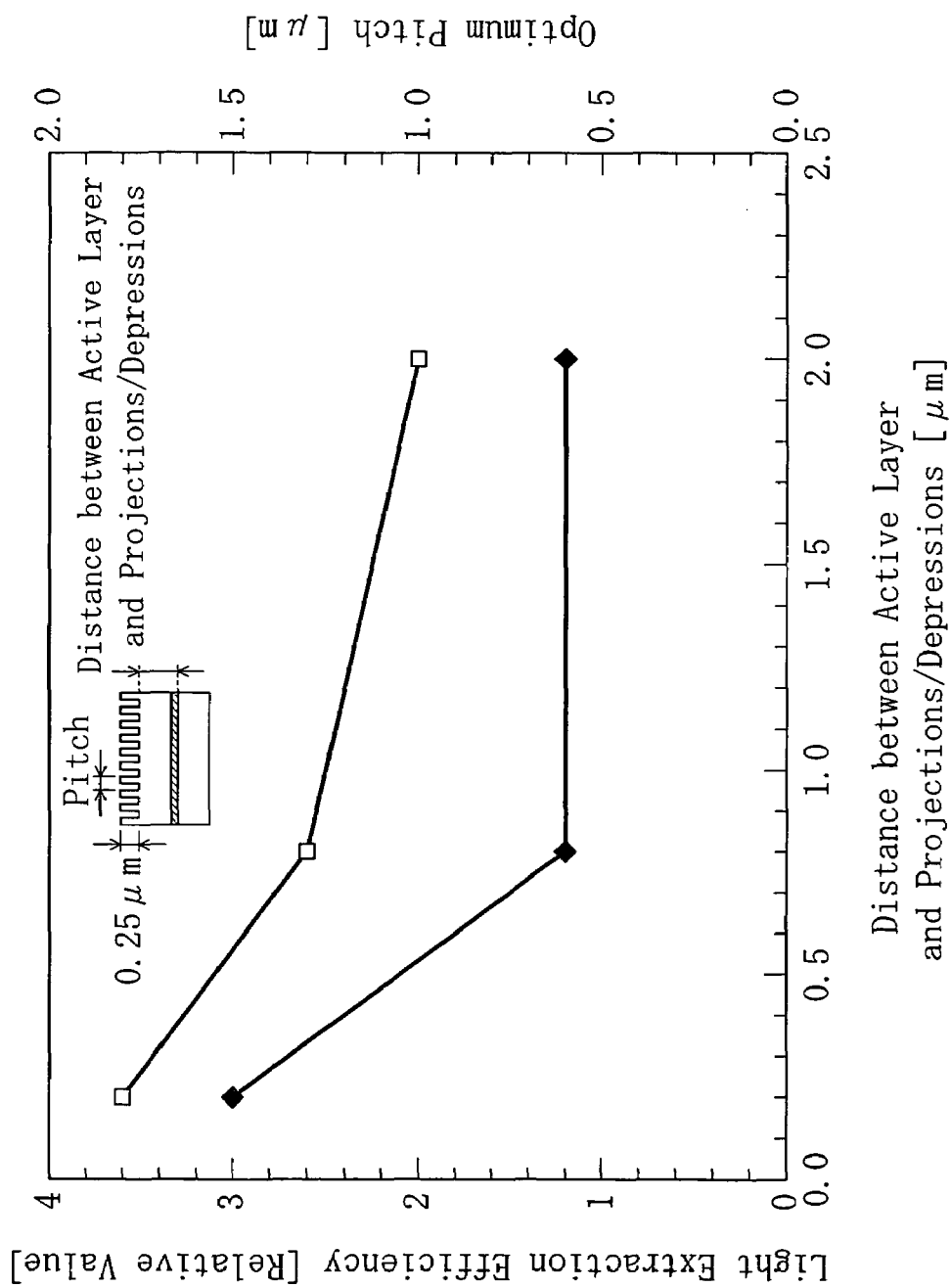
FIG. 11 is a graph showing a relationship between the light extraction efficiency and the distance between an active layer and the projections/depressions.

A description will be given herein below to the result of theoretically calculating a relationship between the height of the projections/depressions and the light extraction efficiency with reference to FIGS. 9 to 11. FIG. 9 is a graph showing the result of theoretically calculating the relationship between the period of the projections/depressions and the light extraction efficiency by varying the height of the projections/depressions in the first embodiment. In the graph, the abscissa represents a relative value of the period of the projections/depressions to the wavelength in the LED and the ordinate represents the light extraction efficiency normalized to the value when the projections/depressions are not formed. Four types of theoretical calculations using the different heights of the projections/depressions were performed and the resulting values are shown as different profiles. It is to be noted that the relative values of the heights of the projections/depressions in FIG. 9 are the heights of the projections/depressions relative to the wavelength in the LED. FIG. 10 is also a graph showing the relationship between the heights of the projections/depressions in the LED at the light emission wavelength of 450 nm and the light extraction efficiency, similarly to FIG. 9. However, in contrast to FIG. 9 which shows the period and heights of the projections/depressions as relative values, FIG. 10 shows the period and heights of the projections/depressions as specific values. FIG. 11 is a graph showing a relationship between the light extraction efficiency and a distance between the active layer and the projections/depressions. In FIG. 11, the abscissa represents a distance between the depressed portions of the projections/depressions and the active layer and the ordinate represents the light extraction efficiency.

As can be seen from FIG. 11, the light extraction efficiency increases as the distance between the projections/depressions and the active layer decreases. Since the light extraction efficiency is higher when the distance between the active layer and the projections/depressions is about 0.9 μm or less in FIG. 11, it may be said that the distance between the active layer and the projections/depressions is preferably five times (180 nm) the wavelength in the LED or less. In the case where the distance between the active layer and the projections/depressions is thus small, the light extraction efficiency becomes double the conventional light extraction efficiency or more even when the height of the projections/depressions is as small as about 1 times the wavelength in the LED (about 180 nm). This is because the active layer and the projections/depressions are in proximity so that the projections/depressions need not be so high. Thus, it is sufficient for the projections/depressions necessary for diffracting light in the present embodiment to have a depth smaller than that of the conventional projections/depressions which refract light with the provision of the lens and thereby improve the light extraction efficiency. Since the depth of the projections/depressions formed in a nitride compound semiconductor, which is difficult to process, can be reduced in the present embodiment, processing is easier than in the conventional embodiment and fabrication cost can also be reduced.

Figure 12A:
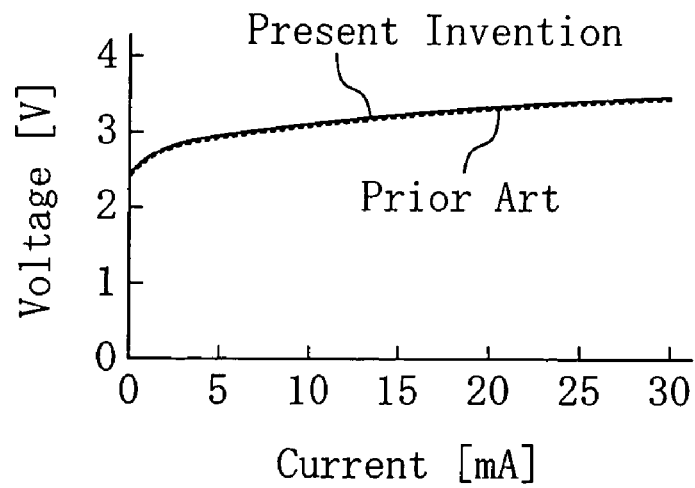
Figure 12B:
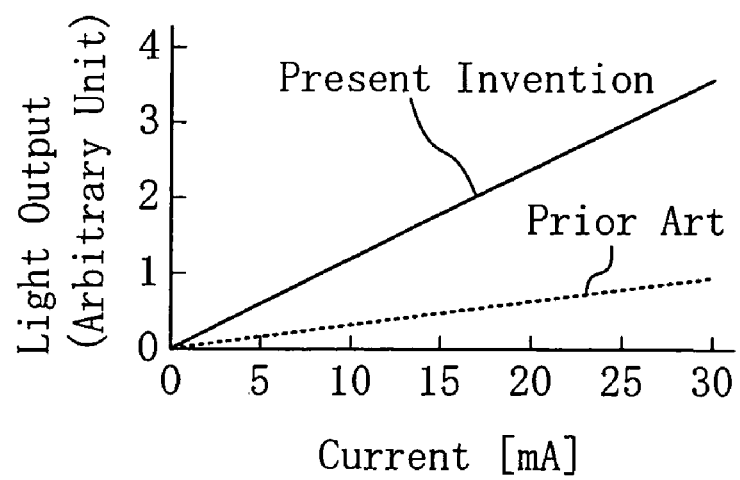

The characteristics of the semiconductor light-emitting device according to the present embodiment will be described with reference to FIGS. 12A and 12B. FIGS. 12A and 12B are graphs showing the characteristics of the semiconductor light-emitting device according to the first embodiment, of which FIG. 12A shows the current-voltage characteristic and FIG. 12B shows the current-light output characteristic. Each of the graphs also shows, for comparison, the characteristics of a semiconductor device of a conventional structure in which projections/depressions are not formed at the surface of the p-type GaN layer 4 (having a film thickness of 200 nm).

From the current-voltage characteristic of FIG. 12A, it can be seen that the rising voltage of the semiconductor light-emitting device according to the present embodiment shows substantially the same curve as that of the conventional embodiment. This indicates that, in spite of the projections/depressions as shallow as 200 nm provided at the surface of the p-type GaN layer 4 of the semiconductor light-emitting device according to the present embodiment, the current-voltage characteristic thereof has not been adversely affected thereby compared with that of the conventional embodiment in which projections/depressions are not formed.

From the current-light output characteristic of FIG. 12B, it can be seen that a light output obtained with the same current from the device according to the present embodiment has increased to 3.5 times the value obtained from the conventional embodiment, which is substantially the same as the result of the theoretical calculation shown in FIG. 8. This may be because a reduction in internal quantum efficiency and a reduction in power conversion efficiency each resulting from the formation of projections/depressions are circumvented in the semiconductor light-emitting device according to the present embodiment.

That is, since the present embodiment has formed the projections/depressions only in the p-type GaN layer (contact layer) at a distance from the active layer, an increase in hole-electron surface recombination caused by the projections/depressions can be circumvented compared with the case where the projections/depressions are formed even in the active layer. This prevents a reduction in internal quantum efficiency (the proportion of currents injected into the LED and converted to light in the LED to all the currents injected into the LED). By forming the transparent electrode 5 entirely over the projections/depressions, the currents can be injected uniformly into the p-type GaN layer irrespective of the projections/depressions of the p-type GaN layer. This prevents a reduction in power conversion efficiency resulting from non-uniform injection of the currents. Thus, the present embodiment can provide the semiconductor light-emitting device high in light extraction efficiency without lowering the current characteristics and with high mass producibility.

EMBODIMENT 2

Figure 13:
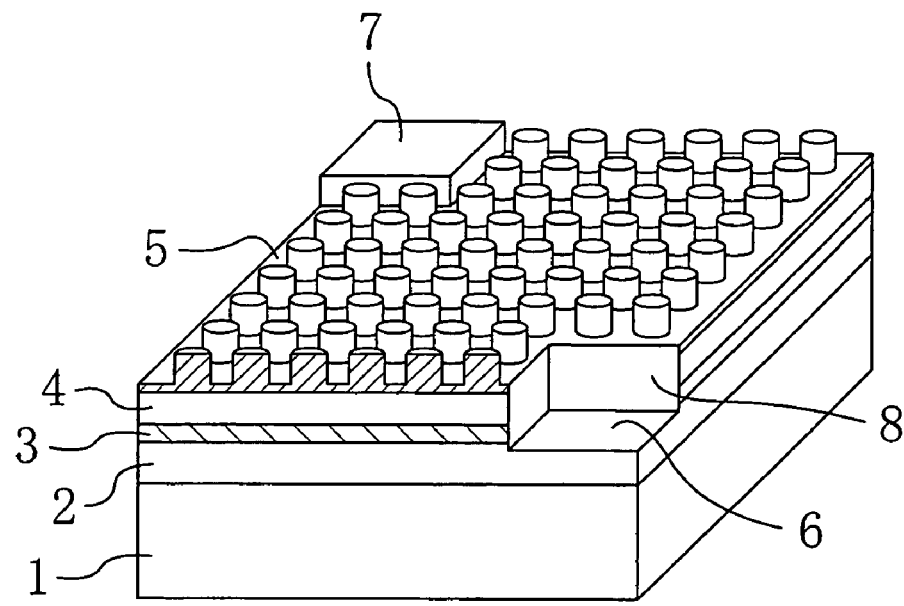
FIG. 13 is a perspective view showing a structure of a semiconductor light-emitting device according to a second embodiment of the present invention.

FIG. 13 is a perspective view showing a structure of a semiconductor light-emitting device according to a second embodiment of the present invention. As shown in FIG. 13, the semiconductor light-emitting device according to the present embodiment is an LED comprising: a sapphire substrate 1; a non-doped GaN buffer layer (not shown) provided on the sapphire substrate 1 and having a thickness of 30 nm; an n-type GaN layer 2 provided on the GaN buffer layer, doped with an n-type impurity at a concentration of $2 \times 10^{18}$ cm$^{-3}$, and having a thickness of 2 μm; an InGaN active layer 3 provided on the n-type GaN layer 2, made of non-doped $In_{0.45}Ga_{0.55}N$ with a PL peak wavelength of 450 nm, and having a thickness of 3 nm; and a p-type GaN layer 4 provided on the InGaN active layer 3, doped with a p-type impurity at a concentration of $7 \times 10^{17}$ cm$^{-3}$, and having a thickness of 200 nm.

A trench 8 for exposing the n-type GaN layer as the upper surface thereof has been formed by partly etching away the InGaN active layer 3 and the p-type GaN layer 4.

As a transparent electrode 5, a transparent metal oxide having conductivity such as ITO has been provided to a thickness of 300 nm on the p-type. GaN layer 4. The transparent electrode 5 has been formed on the p-type GaN layer 4 by sputtering or CVD (Chemical Vapor Deposition). The upper surface of the transparent electrode 5 is formed with projections/depressions with a period of 0.5 μm and a height of 200 nm which are arranged in a two-dimensional periodic structure. These projections/depressions are produced by the following method. First, a metal oxide film (not shown) having a flat upper surface is deposited on the p-type GaN layer 4. Then, a resist is formed on the metal oxide film and patterned by a method or system such as interference exposure, electron beam exposure, or a stepper such that a resist pattern for the arrangement of the projections/depressions of a two-dimensional periodic structure is formed on the metal oxide. In this state, dry etching such as RIE or ion milling or wet etching using an acid such as HCl is performed to remove the portions of the metal oxide film uncovered with the resist pattern and thereby form the transparent electrode 5 having the projections/depressions at the upper surface thereof.

A Ti/Al n-side electrode 6 is disposed on the portion of the n-type GaN layer 2 exposed as the bottom surface of the trench 8. Further, an Au p-side bonding electrode 7 is formed on the region of the transparent electrode 5 unformed with the projections/depressions.

The present embodiment is characterized in that the p-type GaN layer 4 has a flat upper surface and the projections/depressions with a two-dimensional period are formed at the surface of the transparent electrode 5. When the period of the projections/depressions is in the range of 1 to 20 times the wavelength in the LED, the light extraction efficiency can be increased by the same diffractive effect as described above in the first embodiment.

In this structure, the projections/depressions are formed in the transparent electrode 5 made of ITO having a refractivity (2.0) lower than that of a nitride compound semiconductor so that an increase in light extraction efficiency is 2.5 times the conventional light extraction efficiency, which is lower than in the first embodiment. However, since the formation of projections/depressions in a metal compound such as ITO is easier than the formation of projections/depressions in a nitride compound semiconductor layer having high etching resistance, the fabrication cost can be reduced. In contrast to the case of forming projections/depressions in a nitride compound semiconductor where device design should be performed with caution by, e.g., providing a distance of about 0.1 µm between the bottom portions of the projections/depressions and the active layer to avoid the lowering of current characteristics, the present embodiment can use the conventional device design without alternations since the semiconductor multilayer film structure of the present embodiment is the same as that of the conventional device.

EMBODIMENT 3

Figure 14:
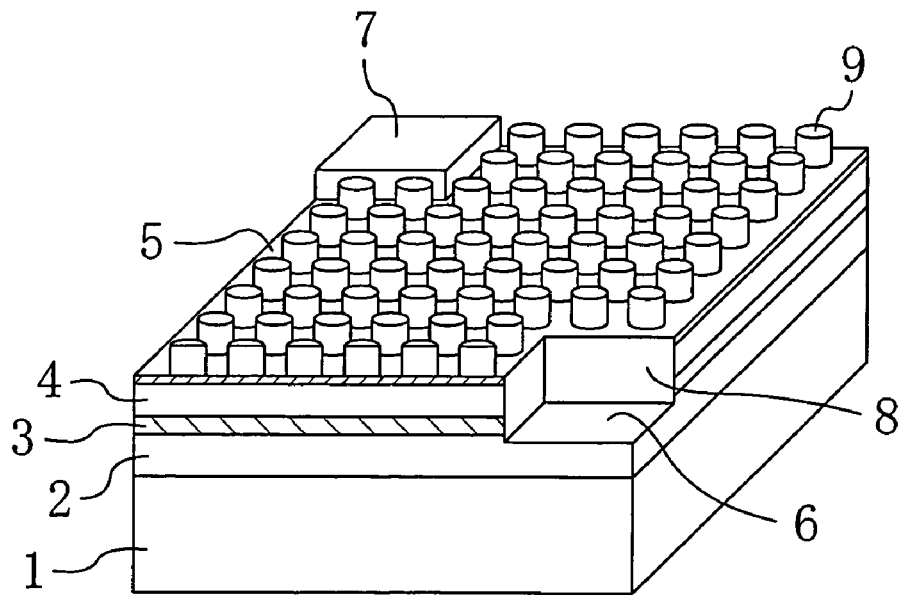
FIG. 14 is a perspective view showing a structure of a semiconductor light-emitting device according to a third embodiment of the present invention.

FIG. 14 is a perspective view showing a structure of a semiconductor light-emitting device according to a third embodiment of the present invention. As shown in FIG. 14, the semiconductor light-emitting device according to the present embodiment is an LED comprising: a sapphire substrate 1; a non-doped GaN buffer layer (not shown) provided on the sapphire substrate 1 and having a thickness of 30 nm; an n-type GaN layer 2 provided on the GaN buffer layer, doped with an n-type impurity at a concentration of $2 \times 10^{18}$ cm$^{-3}$, and having a thickness of 2 µm; an InGaN active layer 3 provided on the n-type GaN layer 2, made of non-doped In$_{0.45}$Ga$_{0.55}$N at a PL peak wavelength of 450 nm, and having a thickness of 3 nm; and a p-type GaN layer 4 provided on the InGaN active layer 3, doped with a p-type impurity at a concentration of $7 \times 10^{17}$ cm$^{-3}$, and having a thickness of 200 nm. These nitride compound semiconductors are formed by crystal growth such as MOCVD or MBE.

A trench 8 for exposing the n-type GaN layer 2 as the bottom surface thereof has been formed by partly etching away the InGaN active layer 3 and the p-type GaN layer 4. As a transparent electrode 5, a film obtained by successively stacking Ni with a film thickness of 10 nm and Au with a film thickness of 40 nm in layers is provided on the p-type GaN layer 4. A Ti/Al n-side electrode 6 is provided on the portion of the n-type GaN layer 2 exposed as the bottom surface of the trench 8.

A plurality of transparent layers 9 each made of a transparent material such as a resin or a metal oxide are arranged in a two-dimensional periodic structure on the upper surface of the transparent electrode 5. The period with which the transparent layers 9 are arranged is 1.5 µm and the height of the transparent layers 9 from the transparent electrode 5 is 300 nm. The present embodiment has used a polycarbonate resin as the material of the transparent layers 9. Further, an Au p-side bonding electrode 7 has been formed on a part of the transparent electrode 5.

When the period of projections/depressions provided by the transparent layers 9 at the surface of the semiconductor light-emitting device is in the range of 1 to 20 times the wavelength in the LED, light extraction efficiency can be increased by the same diffractive effect as achieved in the first and second embodiments described above.

In this structure, the projections/depressions are formed by using a resin with a refractivity (about 1.5) or a metal oxide with a refractivity (about 2.0) lower than that of a nitride compound semiconductor so that an increase in light extraction efficiency is 2.0 to 2.5 times the conventional light extraction efficiency, which is lower than in the first embodiment. However, since it is easier to dispose a resin or a metal oxide in a two-dimensional periodic structure than to partly etch away a nitride compound semiconductor layer having high etching resistance, the fabrication cost can be reduced. Compared with the case where the projections/depressions are formed in the nitride compound semiconductor or in the transparent electrode, the possibility of giving an adverse effect such as non-uniform current injection is reduced. This improves light extraction efficiency without lowering power conversion efficiency.

Figure 15A:
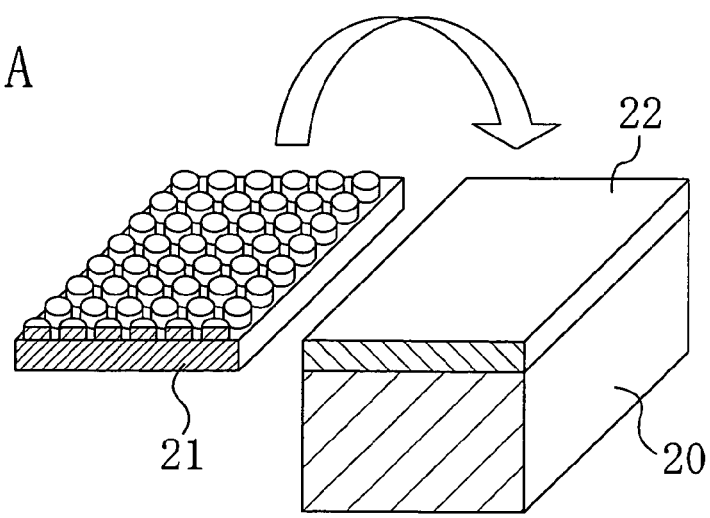
FIGS. 15A to 15C are perspective views illustrating the process steps of forming transparent layers by pressing.
Figure 15B:
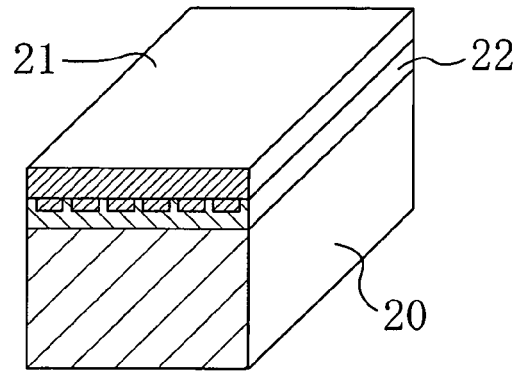
Figure 15C:
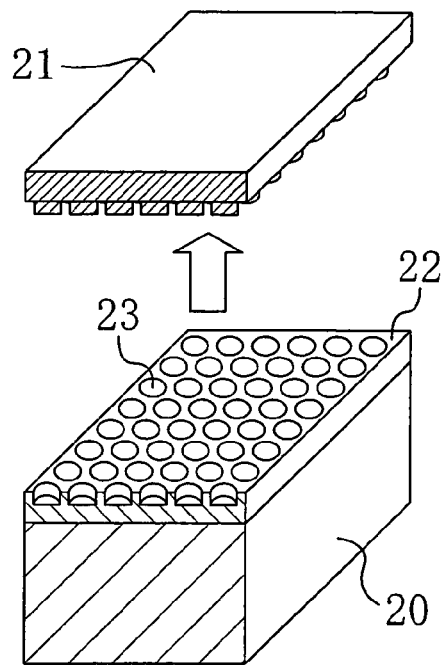
Figure 16:
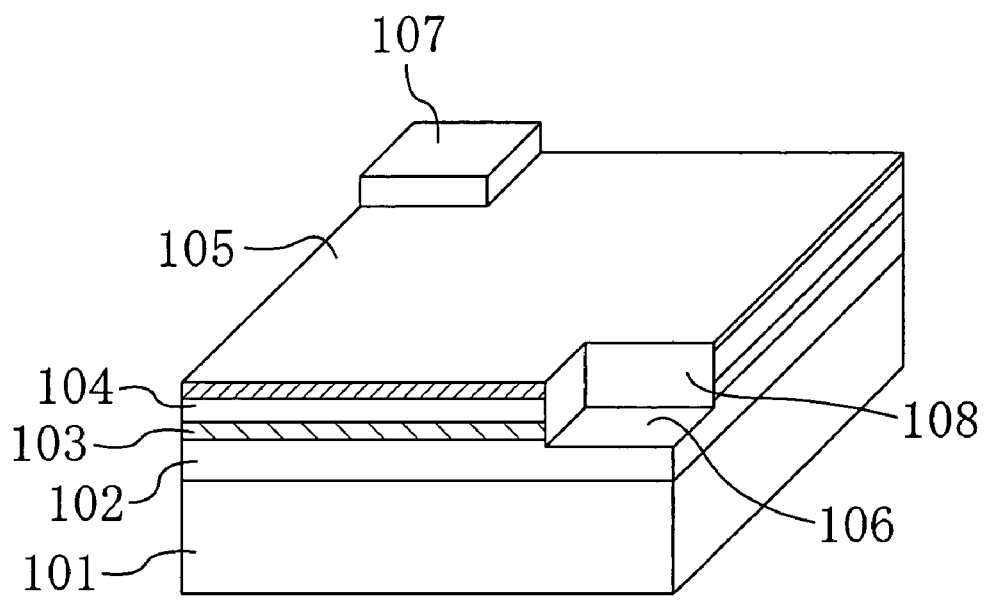
FIG. 16 is a perspective view showing a structure of a conventional nitride compound semiconductor LED disclosed in FIG. 10 of Prior Art Document 1.
Figure 17:
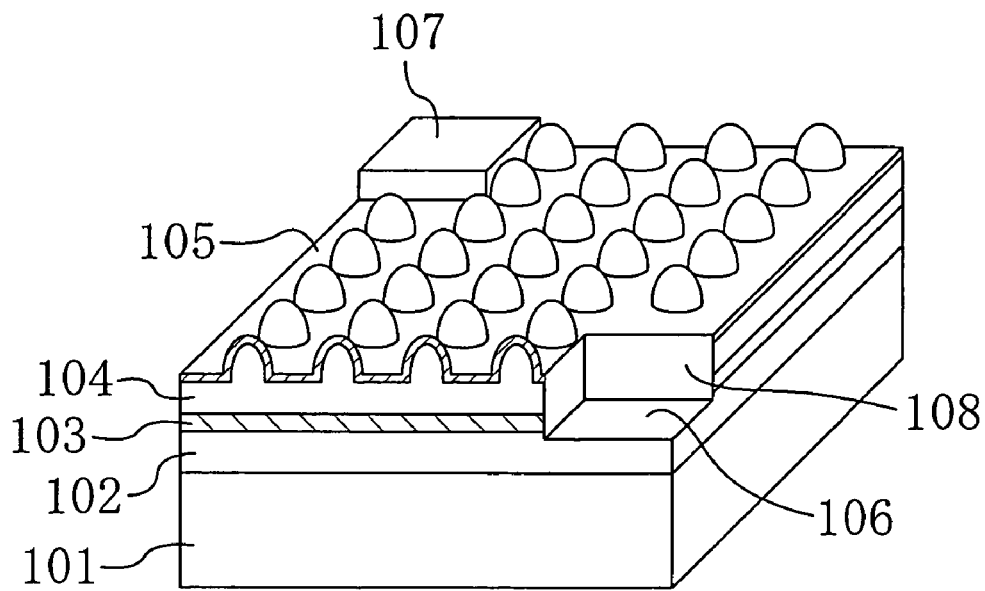
FIG. 17 is a perspective view showing a structure of the conventional nitride compound semiconductor LED disclosed in FIGS. 5A and 5B of Prior Art Document 1.

Since the transparent layers 8 are formed on the transparent electrode 5, conductivity is not required of the transparent layers 8. As a result, a material can be selected with higher flexibility and an easily processible material can be used for the transparent layers 8. If a resin is used for the transparent layers 8, the transparent layers 8 can be formed by transferring the projections/depressions by pressing a stamp preliminarily formed with the projections/depressions against the heated resin without using a semiconductor processing technique such as photolithography or etching. FIGS. 15A to 15C are perspective views illustrating the process steps of forming the transparent layers by pressing. In FIGS. 15A to 15C is shown the case where depressed portions are arranged in the transparent layers, not the case where the transparent layers 8 are provided in projecting relation. In the step shown in FIG. 15A, a mold die 21 having projections/depressions and a light-emitting diode 20 provided with a transparent layer 22 having a flat upper surface are prepared first. Then, in the step shown in FIG. 15B, projections/depressions in inverted relation to the projections/depressions of the mold die 21 are reflected in the transparent layer 22 by joining the surface of the mold die 21 formed with the projections/depressions and the upper surface of the transparent layer 22 and pressing the mold die 21 from above at a temperature which softens the resin or the like composing the transparent layer 22. When the mold die 21 is removed from the transparent layer 22 in the step shown in FIG. 15C, depressed portions 23 arranged in the two-dimensional periodic structure are provided in the surface of the transparent layer 22. Since the method which forms the projections/depressions by pressing allows extremely low cost formation of a microstructure, unlike the foregoing semiconductor techniques such as photolithography and etching, a semiconductor light-emitting device low in cost and high in light extraction efficiency can be fabricated.

Thus, the present embodiment can provide a semiconductor light-emitting device high in light extraction efficiency with high mass producibility.

Although each of the foregoing embodiments has particularly described the case using the nitride compound semiconductor which is difficult to process, the design of the present invention is also applicable to an infrared or red semiconductor light-emitting device using AlGaAs (having a refractivity of 3.6) or AlGaInP (having a refractivity of 3.5) as a semiconductor. The wavelength in the LED becomes about 240 nm in the case of infrared light at an oscillation wavelength of 850 nm and becomes about 180 nm in the case of red light at an oscillation wavelength of 620 nm. Accordingly, it can be seen from FIG. 8 that the effect of improving the light extraction efficiency becomes maximum when the period of the projections/depressions is 1.6 µm in the case of the infrared light and 1.2 µm in the case of the red light. Thus, micrometer-order processing can be implemented at lower cost than submicrometer-order processing.

What is claimed is:

1. A semiconductor light-emitting device comprising an element having:
   a semiconductor multilayer film containing a nitride and having an active layer; and
   a transparent layer provided on the semiconductor multilayer film and having projections/depressions of a two-dimensional periodic structure at an upper surface thereof to diffract light from the active layer at the projections/depressions and guide the diffracted light to an outside of the semiconductor multilayer film,
   wherein, when a period of the projections/depressions is L and a wavelength of the light from the active layer in the element is $\lambda$, $\lambda \leq L \leq 20\lambda$ is satisfied.

2. The semiconductor light-emitting device of claim 1, wherein, when a distance between each of depressed portions of the projections/depressions and the active layer is D and a wavelength of the light from the active layer in the element is $\lambda$, $D \leq 5\lambda$ is satisfied.

3. The semiconductor light-emitting device of claim 1, wherein, when a height of each of the projections/depressions is h and a wavelength of the light from the active layer in the element is $\lambda$, $h \leq 5\lambda$ is satisfied.

4. The semiconductor light-emitting device of claim 1, wherein the transparent layer is a first nitride semiconductor layer and an electrode layer is further provided on the first nitride semiconductor layer.

5. The semiconductor light-emitting device of claim 4, wherein an upper surface of the electrode layer is provided with projections/depressions reflecting the projections/depressions of the upper surface of the first nitride semiconductor layer.

6. The semiconductor light-emitting device of claim 4, wherein the electrode layer is a metal or a metal oxide having a film thickness of 50 nm or less.

7. The semiconductor light-emitting device of claim 4, wherein the electrode layer is an indium tin oxide.

8. The semiconductor light-emitting device of claim 1, wherein
   the semiconductor multilayer film further has a nitride semiconductor layer of a first conductivity type provided on the active layer and a nitride semiconductor layer of a second conductivity type provided under the active layer and
   the transparent layer has an electrode layer provided on the nitride semiconductor layer of the first conductivity type.

9. The semiconductor light-emitting device of claim 8, wherein an upper surface of the electrode layer is provided with the projections/depressions of a two-dimensional periodic structure.

10. The semiconductor light-emitting device of claim 8, wherein the transparent layer further has a layer provided on the electrode layer and having the projections/depressions of a two-dimensional periodic structure.

11. The semiconductor light-emitting device of claim 8, wherein the electrode layer is a metal or a metal oxide having a film thickness of 50 nm or less.

12. The semiconductor light-emitting device of claim 8, wherein the electrode layer is an indium tin oxide.

13. The semiconductor light-emitting device of claim 10, wherein the layer having the projections/depressions of a two-dimensional periodic structure is made of a resin.

14. The semiconductor light-emitting device of claim 13, wherein the projections/depressions are formed by pressing.

15. The semiconductor light-emitting device of claim 1, wherein each of projecting portions of the projections/depressions of the transparent layer has a flat upper surface.

* * * * *